(12) United States Patent
Bluck et al.

(10) Patent No.: US 10,446,430 B2
(45) Date of Patent: Oct. 15, 2019

(54) PATTERNED CHUCK FOR SUBSTRATE PROCESSING

(71) Applicant: Intevac, Inc., Santa Clara, CA (US)

(72) Inventors: Terry Bluck, Santa Clara, CA (US);
Babak Adibi, Los Altos, CA (US);
Vinay Prabhakar, Cupertino, CA (US);
William Eugene Runstadler, Jr., Livermore, CA (US)

(73) Assignee: INTEVAC, INC., Santa Clara, CA (US)

( * ) Notice: Subject to any disclaimer, the term of this patent is extended or adjusted under 35 U.S.C. 154(b) by 287 days.

(21) Appl. No.: 15/410,634

(22) Filed: Jan. 19, 2017

(65) Prior Publication Data

US 2017/0236740 A1    Aug. 17, 2017

Related U.S. Application Data

(60) Provisional application No. 62/280,638, filed on Jan. 19, 2016.

(51) Int. Cl.
| | | |
|---|---|---|
| *H01L 21/683* | (2006.01) | |
| *H01L 21/66* | (2006.01) | |
| *H01L 21/67* | (2006.01) | |
| *H01L 21/687* | (2006.01) | |

(52) U.S. Cl.
CPC .... *H01L 21/6833* (2013.01); *H01L 21/67288* (2013.01); *H01L 21/6831* (2013.01); *H01L 21/6875* (2013.01); *H01L 21/68735* (2013.01); *H01L 22/12* (2013.01)

(58) Field of Classification Search
USPC .......................................................... 361/234
See application file for complete search history.

(56) References Cited

U.S. PATENT DOCUMENTS

| | | | | |
|---|---|---|---|---|
| 2002/0146628 | A1* | 10/2002 | Ota | G03F 7/70066 430/22 |
| 2004/0040665 | A1* | 3/2004 | Mizuno | H01L 21/6833 156/345.51 |
| 2015/0138687 | A1* | 5/2015 | Boyd, Jr. | H01L 21/67288 361/234 |
| 2016/0204000 | A1* | 7/2016 | Kubota | H01L 21/046 438/522 |

* cited by examiner

*Primary Examiner* — Danny Nguyen
(74) *Attorney, Agent, or Firm* — Womble Bond Dickinson (US) LLP; Joseph Bach, Esq.

(57) ABSTRACT

A chuck for wafer processing that counters the deleterious effects of thermal expansion of the wafer. Also, a combination of chuck and shadow mask arrangement that maintains relative alignment between openings in the mask and the wafer in spite of thermal expansion of the wafer. A method for fabricating a solar cell by ion implant, while maintaining relative alignment of the implanted features during thermal expansion of the wafer.

18 Claims, 4 Drawing Sheets

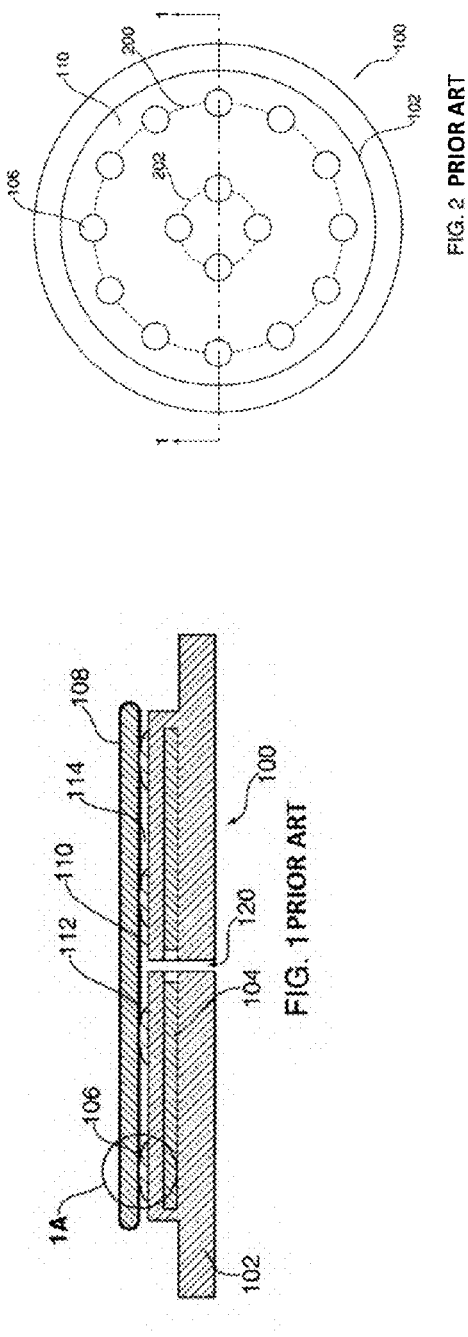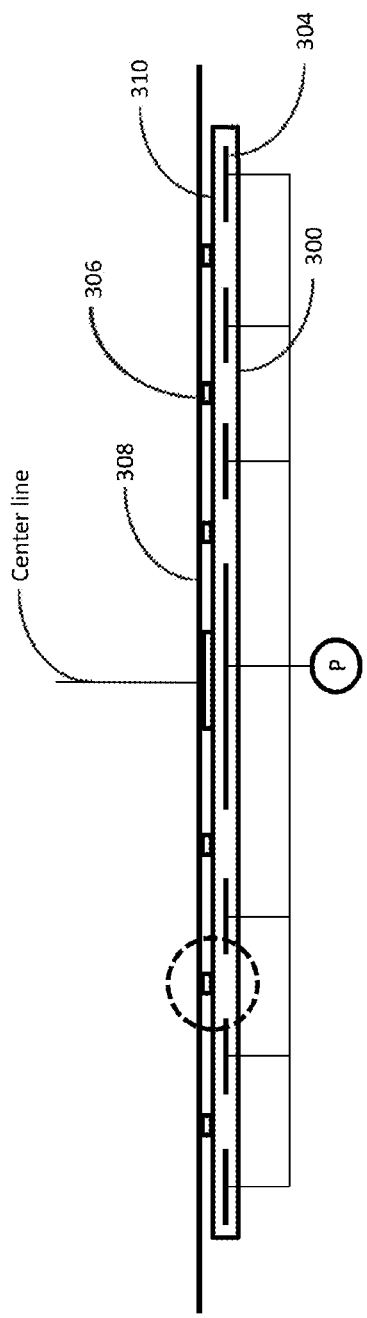
*Figure 3*

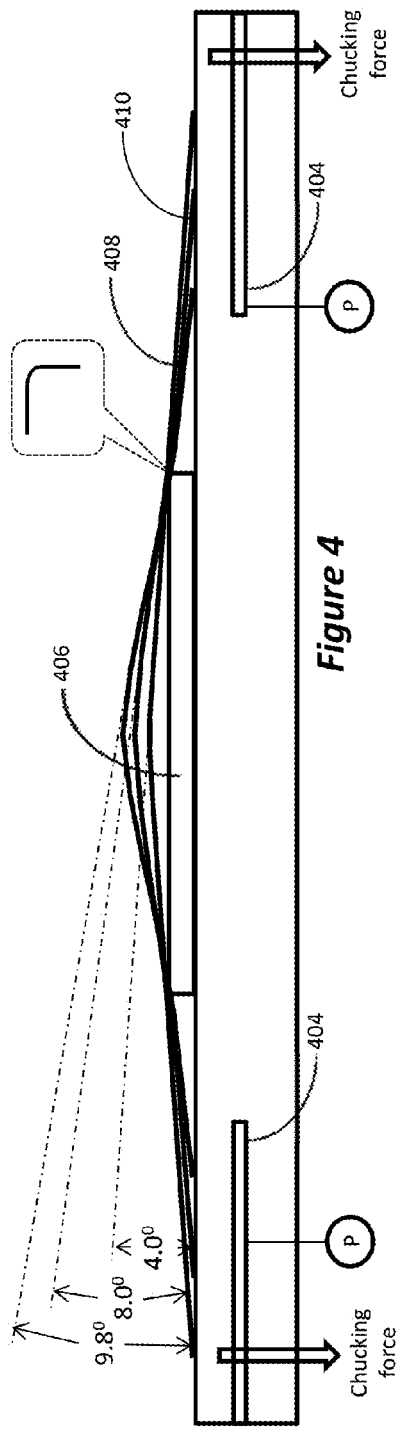
*Figure 4*
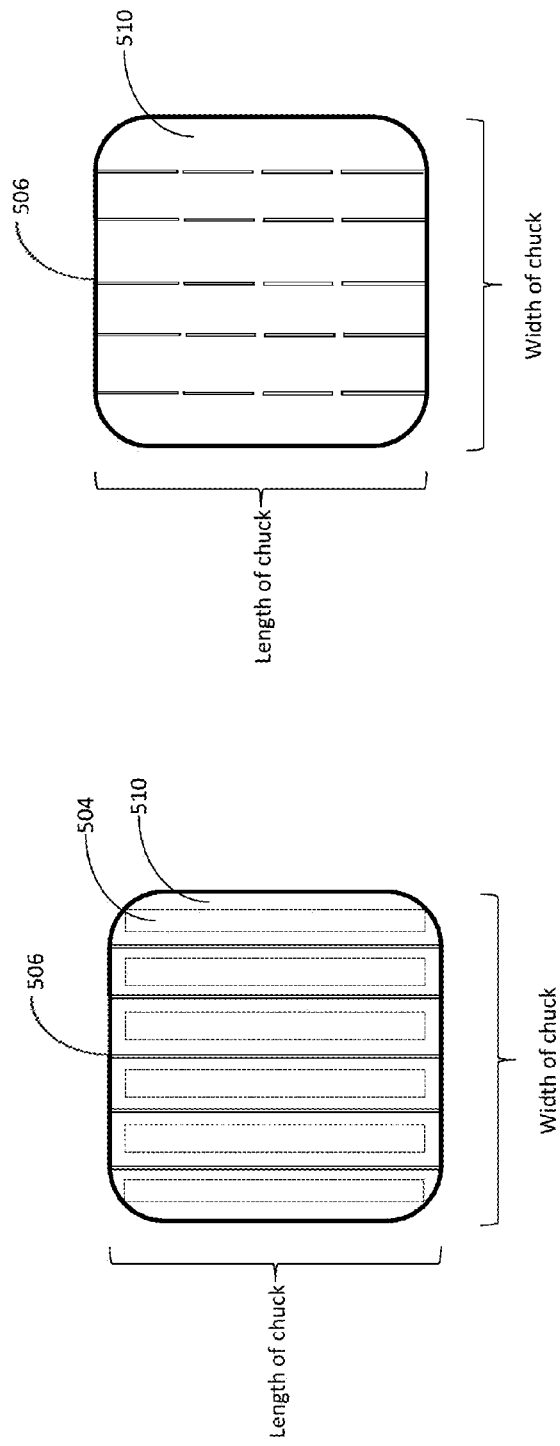
*Figure 5*
*Figure 5A*

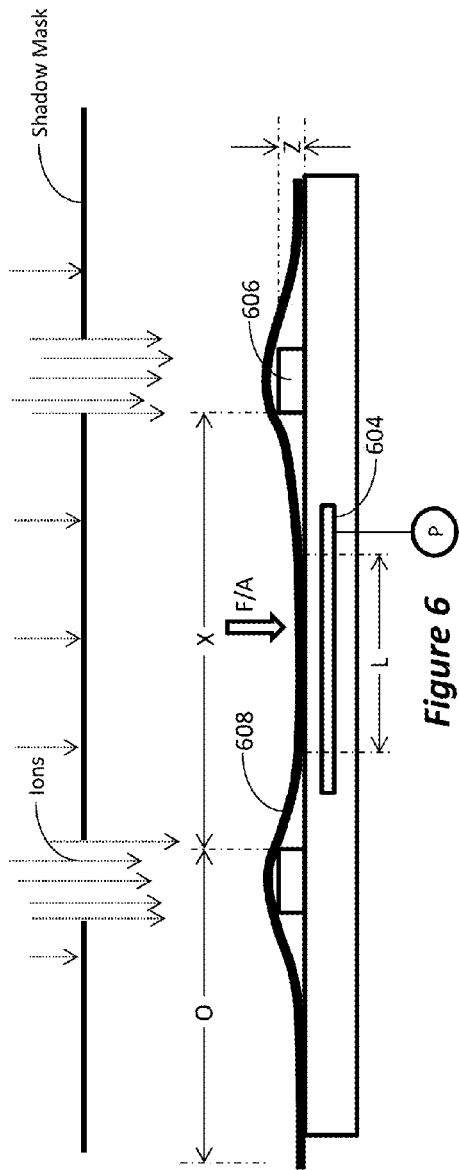
*Figure 6*
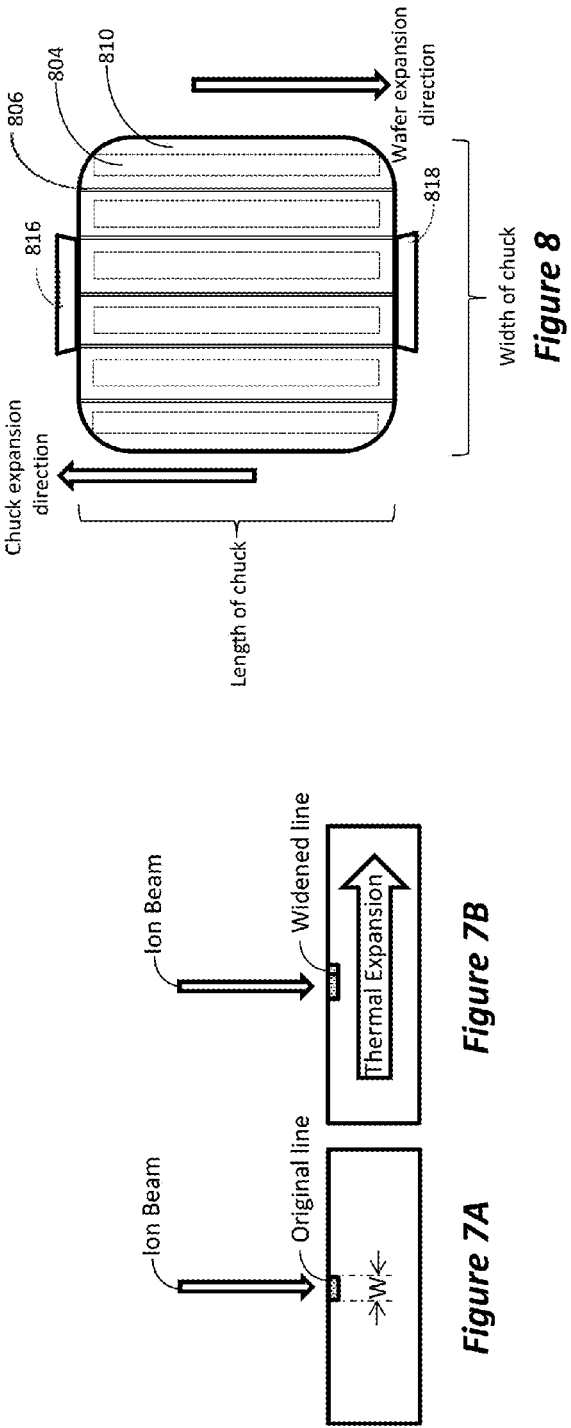
*Figure 7A*
*Figure 7B*
*Figure 8*

United States Patent US 10,446,430 B2

PATTERNED CHUCK FOR SUBSTRATE PROCESSING

RELATED APPLICATION

This application claims priority benefit from U.S. Provisional Application No. 62/280,638, filed on Jan. 19, 2016, the entire disclosure of which is incorporated herein by reference.

BACKGROUND

1. Field

The invention relates to chucks for supporting substrates during processing, such as electrostatic chucks for semiconductor substrates. The invention is particularly beneficial for fabrication of solar cells, which is done using relatively thin silicon wafers.

2. Related Arts

Electrostatic chucks (ESC) are well known in the semiconductor industry. Most chucks have flat and smooth top surface, i.e., the surface contacted by the wafer. Conversely, some chucks have mesas on the top surface. See, e.g., U.S. Pat. No. 5,903,428 disclosing mesas formed from a thin film deposition of a highly-resistive dielectric. The thin-highly resistive film prevents excess DC standby current as well as reduces the dependence of the electrostatic chuck performance on the wafer backside morphology and composition. Another example is U.S. Pat. No. 7,869,184 disclosing a method of modifying the capacitance profile of an electrostatic chuck by adjustment or initial fabrication of the height of a mesa configuration of an insulating layer of the chuck. FIGS. 1 and 2 illustrate prior art chucks having mesas. In the prior art the mesas 106 are generally round "islands" that are used to hold the wafer 108 at a predetermined height 114 from the top surface 110 of the chuck 100. Electrode 104 applies attractive force under the mesas 106. In such configuration the back surface of the wafer only contacts the mesas and not the top surface of the chuck. One of the main reasons to hold the wafer at a distance from the top surface of the chuck is to reduce the chucking power, so that it is easier to remove the wafer after processing. Thus, the height of the mesas and the chucking power are designed to keep the wafer on top of the mesas, away from the top surface of the chuck.

During some process steps the wafer's temperature may increase. This happens, e.g., during plasma processing or during ion implant. Most process steps are performed over the entire surface of the wafer, so that the wafer's thermal expansion does not affect the processing. However, some processes are performed such that only parts of the wafer's surface are exposed to processing. For example, when performing ion implant using a so-called shadow mask, only the ions passing through the openings in the mask reach the wafer, such that the resulting implant is patterned according to the openings in the shadow mask. Thermal expansion of the wafer may not pose a problem, unless the mask openings must be aligned to certain areas of the wafer with high precision. In such a case, thermal expansion may pose a problem, as the mask may be aligned to the wafer at one temperature, but then due to thermal expansion of the wafer that alignment may be frustrated. Accordingly, there is a need in the art to ensure that thermal expansion of the wafer during processing would not cause misalignment of the wafer during processing.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiment provides a chuck for wafer processing that counters the deleterious effects of thermal expansion of the wafer. Disclosed aspects also include a combination of chuck and shadow mask arrangement that maintains relative alignment between openings in the mask and the wafer in spite of thermal expansion of the wafer.

Aspects of the disclosed invention provide a method for fabricating a solar cell by ion implant, while maintaining relative alignment of the implanted features during thermal expansion of the wafer.

Additional aspects include a chuck arrangement that provides anchoring system that mechanically constraining motion so as to maintain alignment during thermal expansion of the chuck and the wafer.

Disclosed aspects provide a chuck for semiconductor wafer, the chuck comprising: a body having an insulating top surface; a plurality of elongated bending means, each configured to cause bending of the wafer upon thermal expansion, such that the wafer assumes a corrugated shape, and wherein all of the elongated bending means are positioned parallel to each other; and an electrode embedded within the body. The electrode may comprise a plurality of elongated electrode plates, wherein each electrode plate is positioned between two elongated bending means, or it may comprise one single plate provided over the entire area of the chuck. Each of the elongated bending means may extend through the entire length of the insulating top surface or may extend through part of the insulating top surface, such that an anchoring area is defined on the top surface having no elongated bending means therein. Each of the elongated bending means may comprises: a linear mesa, a plurality of linear mesas arranged along a single row, a linear trench extending through entire length of the insulating top surface or through part of the length. The chuck may further comprise an anchor mechanically constraining motion of the chuck at one side, and enabling thermal expansion of the chuck on opposite side.

According to other aspects, a chuck for semiconductor wafer processing is provided, comprising a plate having a top surface, a plurality of elongated straight ribs, each elongated straight rib extending the entire length of the top surface of the chuck, wherein the width and height of each elongated rib is configured such that when a chucking potential is applied to the chuck, the wafer bends around each elongated rib so that back surface of the wafer contacts the top surface of the chuck and the number of elongated ribs is configure to generate an expansion compensation to compensate for thermal expansion of the wafer upon heating. The chuck may further comprise a plurality of elongated electrodes embedded within the chuck and each electrode positioned between two elongated ribs. The chuck may further comprise an anchor mechanically constraining motion of the chuck at one side, and enabling thermal expansion of the chuck on opposite side. The top surface and/or the straight ribs may be an insulator and may be anodized aluminum. The width and height of each elongated rib is configured to enable a bending of the wafer to a deflection angle of up to ten degrees, wherein the deflection angle is defined by an angle from the top surface of the chuck to a line that is tangential to a bump caused by bending of the wafer.

Also, a method for processing a semiconductor wafer is provided, comprising: providing a chuck having a top surface and a plurality of elongated bending means formed on the top surface; placing the wafer on the chuck; determining thermal expansion of the wafer; and applying a chucking potential to the chuck so as to cause the wafer to bend about each of the elongated bending means so that the wafer assumes a corrugated topography. The method may further comprise increasing the chucking potential according to temperature increase of the wafer. The method may further comprise mechanically anchoring one side of the chuck

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIGS. 1 and 2 illustrate prior art chucks having mesas.

FIG. 3 illustrates a side view of a chuck according to one embodiment.

FIG. 4 is a close-up of the area shown inside the dotted circle in FIG. 3.

FIG. 5 illustrates a top view of a chuck according to one embodiment, while FIG. 5A, illustrates a top view according to another embodiment wherein each linear mesa arrangement comprises four elongated mesas arranged along a single line.

FIG. 6 illustrate a side view of a section of the chuck with a wafer being pulled over the ribs, according to one embodiment.

FIGS. 7A and 7B illustrate an example of widening of dopant distribution over the width of the finger due to thermal expansion of the wafer.

FIG. 8 illustrates an embodiment wherein thermal expansion control is obtained in two dimensions.

FIG. 9 illustrates another embodiment for countering the wafer misalignment due to thermal expansion, while

DETAILED DISCLOSURE

Figure 9:
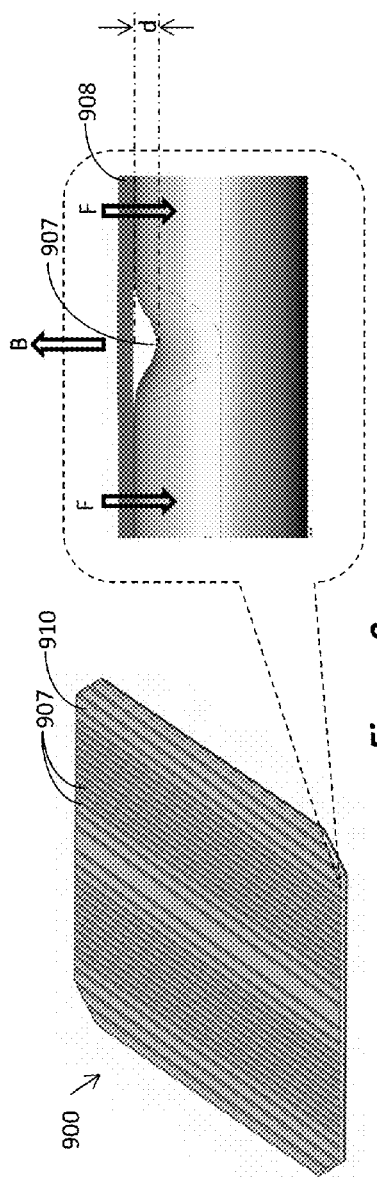

Aspects of the invention relates to countering the deleterious effects of thermal expansion of wafers during fabrication of semiconductor devices. The features of the disclosed embodiments can be implemented in various applications and processes, and some features may be used alone or in combination with other disclosed features. Rather than discuss all possible applications and variations, the following disclosure will focus on embodiments that best illustrate the structure, use and benefits of the disclosed feature. One application that can gain benefit from aspects of the invention is the fabrication of selective emitter solar cell.

Selective emitter solar cells have highly doped regions underneath the front side metallization grid lines (busbars and fingers) and a lowly doped region between the front grid lines. The subject inventors have designed a system for ion implantation into silicon wafer, e.g., ion implantation for selective emitter of solar cells, wherein ions are implanted in the shape of the busbar and fingers of the solar cell. Such ion implant, and many other patterned implants, require high accuracy of the location of the ions implanted into the wafer, to ensure that the region implanted is at the location and shape where the metallization will be formed. However, the subject inventors noted that during processing the temperature of the wafer and the chuck increases, thereby leading to thermal expansion of the wafer and/or the chuck, thus causing misalignment of the implanted regions. Embodiments of the subject invention counter thermal expansion of the wafer and/or the chuck, so that the wafer remains aligned for the ion implantation throughout the process.

During ion implant for selective emitter, the diameter of interest is the top projection of the wafer, i.e., the top surface of the wafer as seen by the stream of ions. According to one embodiment, the top surface of the chuck is provided with elongated protrusions, such as elongated mesas or ribs, which traverse substantially the entire length or width of the chuck. The height, width, separation and number of the protrusions is configured such that when chucking potential is applied to the chuck, the wafer is attracted towards the chuck and bends so that parts of the wafer contact the top surface of the chuck between the protrusions, thereby assuming a corrugated shape. Corrugated shape means having a wavy surface or a surface having alternate furrows and ridges. The corrugated shape shrinks the top projection of the wafer. However, the corrugation (furrows and ridges) must be extremely shallow, so as not to break the wafer.

FIG. 3 illustrates a side view cross-section of an embodiment wherein the wafer 308 is placed on top of the elongated mesas 306 and is not touching the top surface 310 of the chuck 300. In this embodiment the profile of the mesas 306, i.e., width and height, is calculated so that when sufficient chucking potential from power source P is applied to the electrode plates 304, it attracts the wafer 308 so that the wafer 308 bends and may even touch the top surface 310 of the chuck 300 in areas between the mesas 306. That is, the profile of the mesas 306 and the separation between the mesas must be structured such that the wafer 308 bends and touches the top surface 310 of the chuck 300 without breakage. Note also that in the embodiment of FIG. 3 the chucking electrode is provided in the form of a plurality of electrode plates 304, each provided only at areas between two mesas, except that in the center the electrode extends below the central mesa as well, so as to prevent over-bowing of the wafer. If no central mesa is provided, the electrodes 304 may be provided only at areas between the mesas so that no chucking force is applied to the wafer at the location of the mesas. The top surface 310 of the chuck or the top surface of the chuck may be an insulator, such as, e.g., anodized aluminum. Similarly, the elongated mesas 306 may be formed of an insulator, such as, e.g., anodized aluminum.

As shown in the enlarged section depicted in FIG. 4, depending on the chucking potential applied to the electrode plates 404, the wafer 408 bends around the elongated mesa 406, so that different amount of the wafer touches the top surface 410 of the chuck. The bending can be characterized by the angle the bump of the wafer makes with the flat top surface 410 of the chuck 400. This deflection angle is defined by measuring an angle from the flat top surface 410 of the chuck to a line that is tangential to the rise of the bump, as illustrated by the dash-dot lines in FIG. 4. Three different examples are superimposed in FIG. 4, illustrating bending due to different chucking forces, thereby increasing the angle from 4° to 9.8°. This angle cannot increase to a point where the wafer breaks and in this embodiment is limited to 10°. Also, in some embodiments the upper corners of the mesas are rounded, as shown in the callout, to prevent harming the wafer as it bends.

In order to make the wafer bend into a corrugated form, the mesas need to be elongated and arranged linearly and in parallel to each other across the entire or much of the length of the chuck. FIG. 5 is a top view illustrating one example, wherein each elongated mesa 506 extends the entire length of the chuck. As shown, all of the mesas 506 are arranged linearly in one direction and are positioned parallel to each other. Thus, when the chucking force is applied to the electrode plates 504 (shown in dotted lines), the wafer bends to generate several bumps, somewhat like waves or corrugated metal sheet. Note that in the disclosed embodiments the chuck is square (or pseudo-square) so that the length and width are interchangeable.

The mesas need not necessarily be formed as a single mesa extending the entire length of the chuck. However, they must be aligned along a line extending the entire length and the lines must be parallel to each other. As example is shown in FIG. 5A, wherein each linear mesa arrangement comprises four elongated mesas arranged along a single line extending across the chuck's length.

FIG. 6 illustrate a side view of a section of the chuck with a wafer 608 being pulled over the ribs 606. In FIG. 6, F/A indicates the electrostatic force per unit area exerted on the wafer by the potential on the electrode plate 604, O indicates the distance from the first (or last) rib to the edge of the wafer, X indicates the distance between ribs, L indicates the amount of contact area of the wafer with the top surface of the chuck (e.g., as percentage of the wafer), which can be controlled by changing the potential P applied to the electrode, thus changing F/A, Z indicates the height of the ribs. As illustrated in FIG. 6, the structure of the elongated mesas 606, also referred to herein as ribs, can be described mathematically as $Z=f(x, L, F)$. When the total thermal expansion of the wafer is A and the amount of compensation created by each rib is B, the required number of ribs N is given as $N=A/B$. Then x is given by (total width of substrate)/(N+1) or (total width of substrate−O)/(N−1).

The embodiments described counter the deleterious effect of thermal expansion of the wafer. This provides tremendous benefit in situation where the features to be implanted are all structured in one direction. One example is implanting the dopants under the location of the fingers of a selective emitter. If no compensation is provided, as the implant progresses and the wafer warms up, it expands such that the implant forms wider fingers than designed. Also, due to the thermal expansion the dopant distribution over the width of the finger would not be uniform. This is illustrated in FIGS. 7A and 7B.

In FIG. 7A a defined beam is used to implant dopants in a line of designed width W. As implant progresses, the wafer undergoes thermal expansion, as shown in FIG. 7B. Consequently, the width of the line widens as well to $W+\Delta W$. This problem is overcome by the embodiments described above using the mesas to reduce the projection of the wafer by an amount that cancels the thermal expansion. The amount is controlled by the power applied to the electrodes of the chuck. In FIG. 6, a shadow mask is used to define the areas to be implanted by the ions. For example, the mask can delineate the areas under the fingers of a selective emitter. As the wafer heats up, the chucking force can be increased so as to cause increased bending of the wafer, such that the projection of the area under the opening in the shadow mask remains the same. Consequently, the width of the implanted line remains constant.

EXAMPLE 1

A chuck was designed with seven mesas, one center mesa having an electrode below it, and three mesas on each side with electrodes only between the mesas, not under them. Applying a chucking voltage to cause a 4° deflection yielded a contraction of 2.8 microns per mesa, increasing the chucking voltage to cause an 8° deflection yielded a contraction of 7.4 microns per mesa, and increasing the chucking voltage to cause a 9.8° deflection yielded a contraction of 10.5 microns per mesa, without wafer breakage. Thus, the total contraction available using this chuck was 7×10.5 microns=73.5 microns.

In cases where thermal control is desired in two dimensions, one dimension is controlled using the method described above, and the other is controlled using the method illustrated in FIG. 8. In FIG. 8, thermal expansion in the direction of the width of the chuck is countered using the ribs 806. To counter the thermal expansion in the direction of the length of the chuck, the chuck is anchored on one side by anchor 818, mechanically constraining motion of the chuck on one side, while the wafer is anchored so as to be constrained from motion on the opposite direction by anchor 816. Thus, as the chuck expands in one direction, the wafer expands in the opposite direction, thereby countering misalignment due to the thermal expansion.

FIG. 9 illustrates another embodiment for countering the wafer misalignment due to thermal expansion. In the embodiment of FIG. 9 no mesas are utilized. Instead, the chucking force is applied to the wafer unevenly, thereby allowing parts of the wafer to expand, causing it to bow. The effect is achieved as follows. The top surface 910 of the chuck 900 is provided with several linear grooves 907. Consequently, when the wafer is placed on the chuck, much of the wafer contacts the top dielectric layer of the chuck, but at the groove the wafer is distant from the dielectric by a distance d, shown in the callout of FIG. 9, which is in air or vacuum, depending on the process being carried. The chucking force on the wafer is a function of the dielectric constant, the applied chucking voltage and inverse square of the distance from the charge on the wafer to the charge on the electrode of the chuck. At the groove, the dielectric constant is 1, while away from the groove the dielectric constant would depend on the dielectric material of the chuck, and as an example may be 9-10 if it is anodized aluminum. Thus, the chucking force F on the wafer away from the groove 907 is about ten times larger than at the groove 907. Therefore, as the wafer thermally expands, since it is anchored by strong chucking forces on both sides of the groove, but experiences low chucking force above the groove, it will bow up above the groove 907 in a direction indicated as B in the callout.

Figure 9A:
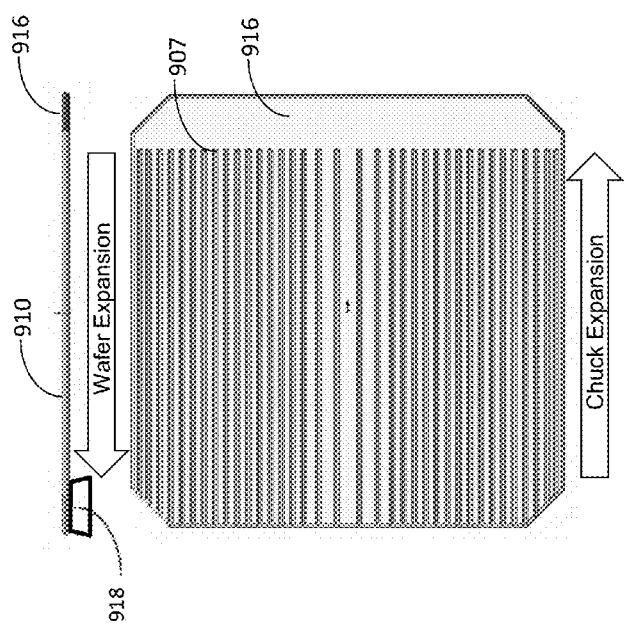
FIG. 9A illustrates an embodiment wherein thermal expansion control is obtained in two dimensions.

The thermal control expansion of FIG. 9 can be integrated with the thermal expansion control of FIG. 8 by the embodiment illustrated in FIG. 9A. As shown in FIG. 9A, the linear grooves 907 extend only partially across the chuck, thereby forming a groove-free area 916. Since no grooves are present at area 916, the chucking force on the wafer over this area is uniform. Consequently, area 916 functions as an anchor for the wafer. Conversely, since the chucking force over the remainder of the chuck, where grooves exist is lower, the wafer can expand in the direction away from area 916. By mechanically anchoring 918 the chuck in the opposite direction to area 916, the chuck can thermally expand in a direction opposite to the wafer expansion. Thus, the thermal expansion of the wafer and chuck can be cancelled out.

While this invention has been discussed in terms of exemplary embodiments of specific materials, and specific steps, it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A chuck for semiconductor wafer, comprising:
a body having an insulating top surface;
a plurality of elongated bending means, each configured to cause bending of the wafer upon thermal expansion, such that the wafer assumes a corrugated shape, and wherein all of the elongated bending means are positioned parallel to each other;
an electrode embedded within the body; and,
wherein each of the elongated bending means extends through part of the insulating top surface, such that an anchoring area is defined on the top surface having no elongated bending means therein.

2. The chuck of claim 1, wherein the electrode comprises a plurality of elongated electrode plates, each electrode plate positioned between two elongated bending means.

3. The chuck of claim 2, wherein each of the elongated bending means extends through entire length of the insulating top surface.

4. The chuck of claim 3, wherein each of the elongated bending means comprises a linear mesa.

5. The chuck of claim 3, wherein each of the elongated bending means comprises a plurality of linear mesas arranged along a single row.

6. The chuck of claim 1, wherein the electrode comprises a single electrode plate.

7. The chuck of claim 6, wherein each of the elongated bending means comprises a linear trench extending through entire length of the insulating top surface.

8. The chuck of claim 1, further comprising an anchor mechanically constraining motion of the chuck at one side, and enabling thermal expansion of the chuck on opposite side.

9. A chuck for semiconductor wafer, comprising a plate having a top surface, a plurality of elongated straight ribs, each elongated straight rib extending the entire length of the top surface of the chuck, wherein the width and height of each elongated rib is configured such that when a chucking potential is applied to the chuck, the wafer bends around each elongated rib so that back surface of the wafer contacts the top surface of the chuck and the number of elongated ribs is configure to generate an expansion compensation to compensate for thermal expansion of the wafer upon heating.

10. The chuck of claim 9, further comprising a plurality of elongated electrodes embedded within the chuck and each electrode positioned between two elongated ribs.

11. The chuck of claim 9, further comprising an anchor mechanically constraining motion of the chuck at one side, and enabling thermal expansion of the chuck on opposite side.

12. The chuck of claim 9, wherein the top surface is an insulator.

13. The chuck of claim 9, wherein the top surface comprises anodized aluminum.

14. The chuck of claim 9, wherein the elongated straight ribs surface are insulators.

15. The chuck of claim 9, wherein the elongated straight ribs comprise anodized aluminum.

16. The chuck of claim 9, wherein the width and height of each elongated rib is configured to enable a bending of the wafer to a deflection angle of up to ten degrees, wherein the deflection angle is defined by an angle from the top surface of the chuck to a line that is tangential to a bump caused by bending of the wafer.

17. A method for processing a semiconductor wafer, comprising:
providing a chuck having a top surface and a plurality of elongated bending means formed on the top surface;
placing the wafer on the chuck;
mechanically anchoring one side of the chuck;
determining thermal expansion of the wafer; and
applying a chucking potential to the chuck so as to cause the wafer to bend about each of the elongated bending means so that the wafer assumes a corrugated topography.

18. The method of claim 17, further comprising increasing the chucking potential according to temperature increase of the wafer.

* * * * *